June 23, 1964 B. M. TARAUD 3,138,503

PRINTED CIRCUIT MANUFACTURING PROCESS

Filed Aug. 12, 1960

INVENTOR
BERNARD M. TARAUD
BY Kemon, Palmer, Stewart and Estabrook
ATTORNEYS

United States Patent Office 3,138,503
Patented June 23, 1964

3,138,503

PRINTED CIRCUIT MANUFACTURING PROCESS

Bernard Marc Taraud, Vanves, Seine, France, assignor to Societe d'Electronique et d'Automatisme, Courbevoie, Seine, France Filed Aug. 12, 1960, Ser. No. 49,234
Claims priority, application France Mar. 31, 1960
1 Claim. (Cl. 156—3)

Figure 1:
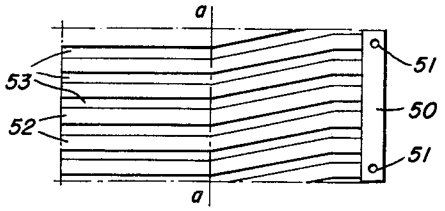

The present invention concerns the manufacturing of printed circuits having relatively thick conductors, i.e. the thickness of said conductors may reach the order of a millimetre or more.

The invention more particularly relates to those of such "thick conductor" printed circuits wherein, in part at least, the pattern of said conductors must be contiguous (closely spaced). In such cases it becomes impossible in actual practice to photo-etch the pattern as the chemical attack on the thin lines uncovered by the resist cannot reach the required depth without deterioration of the uniformity of the edges of the conductors which are thus delineated.

It is an object of the invention to so provide a manufacturing process that, notwithstanding said two conditions (thickness of conductors, contiguity of same), still enables the application of the photo-etching method during such manufacturing, since photo-etching still appears to be in other respects of advantageous use per se, although other etching methods can be used.

From another point of view, the thicker the conductor layer at the start of the process, the more difficult it is to have it uniformly adhere to the insulating carrier of the printed circuit. Moreover, further manufacturing operations are rendered difficult in preparing the printed circuit in final form ready for use. A further object of the invention is to provide a process whereby a stronger adherence of the conductors on the said carrier is obtained.

According to the invention, a sheet of any suitable conductive material of the required thickness is photo-etched to the desired pattern with the etching carried on only up to part of its thickness. This sheet may have been previously provided with index holes prior to this etching on parts extraneous to the pattern proper. Thereafter, said partly photo-etched sheet is glued to an insulating carrier of any of the known materials by its photo-etched face so that the glue, entering into the etched ducts reinforce the adherence of the sheet to the carrier. Thereafter, and in registration of patterns by using the index holes, the exposed face of the conductive sheet in said sandwich is again photo-etched until the etched portions reach the etched portions of the first etching. The required pattern is thus obtained without any substantial distortion in the edges of the conductors.

In such a process according to the invention, the thickness of the insulating carrier is not critical and this carrier may then be very thin with respect to the thickness of the circuit conductors. Two-face printed circuits may be obtained by a mere repetition of the above operations. Either two one-face members may be separately prepared, their thin insulating carriers glued together thereafter, and the interconnections from face to face made posteriorly, or the second semi-etched conductive sheet directly glued on the exposed face of the carrier of the first made element and the outer face of said sheet finally etched or, preferably, the two semi-etched sheets glued in due registration on the respective sides of the carrier and the final step of etching conducted simultaneously on both exposed conductive surfaces and the interconnections thereafter made for completing the two-face printed circuit member. In such two-face circuit cases, the marking indexing holes may be the holes through which the face-to-face connections must be later made.

In the accompanying drawings,

FIG. 1 illustratively shows an example of a portion of printed circuit for which the invention may be of special advantage. The circuit which is shown comprises, over an insulating carrier 50 provided with indexing holes 51, a number of conductors 52 delineated by separating lines 53.

FIGS. 2 to 10 respectively show the successive operative steps for manufacturing such a member according to the invention. Said figures are cross-section views with respect to line *a—a* of FIG. 1.

The steps of depositing the photosensitive layer or film over the conductive surface, photoprinting a pattern onto such film and destroying the unimpressed parts of the film, as well as the etching by an acid, proper, being usual steps in the printed circuitry techniques, will not be described in detail. Also, it is not necessary to define the kind of glue used for uniting a sheet of copper to a dielectric sheet, as it is also conventional in such techniques.

Figure 2:
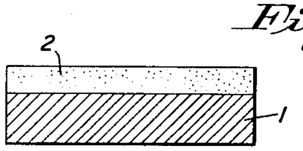
Figure 3:
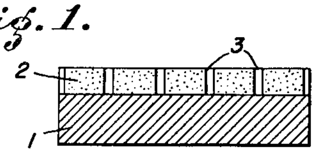
Figure 4:
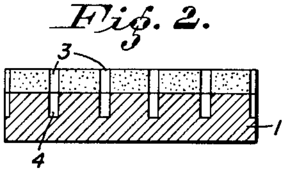
Figure 5:
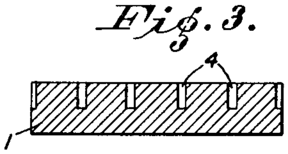
Figure 6:
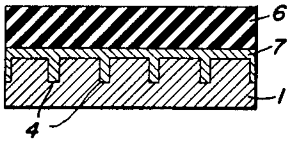
Figure 7:
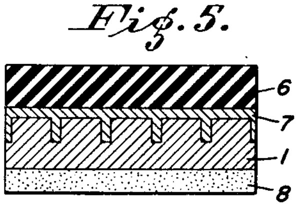

In FIGS. 2 to 10, by way of example, the conductive sheet, copper for example of one millimetre of thickness, is shown at 1. In FIG. 2 said sheet 1 is coated with the photosensitive film 2, in FIG. 3 the photographic print has been made and the non impressed parts of the film destroyed, which has left the ducts 3 without any resist thereon in the film 2. The etching for partial penetration to about half-depth is then carried on and FIG. 4 shows the result of such etching, the ducts 3 extending into the copper by ducts 4. The resist is then removed, which gives the sheet as shown in FIG. 5.

The half-etched or semi-etched sheet is then glued onto an insulating sheet 6 by a glue 7 which substantially also fills the ducts 4, thereby re-inforcing the union between the copper and insulating sheets. The type of glue is not critical and any known type may be used.

Figure 8:
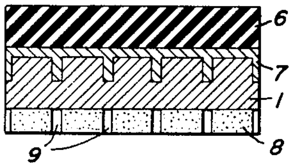
Figure 9:
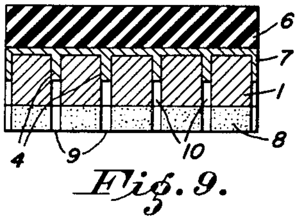
Figure 10:
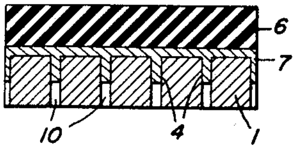

On the exposed face of the copper sheet is then formed a further photosensitive film 8 and, after impressing the pattern of circuit on said film, unprotected ducts 9, FIG. 8, are present in said film. The etching extends said ducts through the copper as shown at 10 in FIG. 9 until they join the ducts 4 previously formed in the copper. After removal of the resist film, FIG. 10, the completely etched printed circuit member is obtained which is of definite and uniform delineation between conductors and characterized by strong adherence of the copper on the insulating base.

I claim:

A process of manufacturing printed circuits from a metal sheet of substantial thickness and for strongly adhering the printed circuit portions to the face of an insulating carrier, and wherein adjacent portions of the printed circuit are separated by narrow gaps formed symmetrically about the central plane of the metal sheet, said process comprising applying to one face of said metal sheet an etching resist layer formed according to the circuit pattern, etching the face of said metal sheet through said resist pattern and to a depth substantially one-half of the thickness of the sheet, removing the resist layer, applying to the etched face of said sheet glueing material to fill the etched gaps and to coat the etched face with glueing material, applying the glue-coated face of said sheet to a face of an insulating carrier to bond the etched face of said sheet to said carrier with the etched gaps remaining filled with glueing material, applying to the opposite unetched face of said sheet a second etching resist layer formed according to the circuit pattern and in registry with the pattern etched on the said one face of the sheet, and etching the sheet through said second resist layer to effect etching of gaps in said opposite face in registry with the gaps in said one face and to a depth to reach the glueing material filling the gaps in said one face.

References Cited in the file of this patent

UNITED STATES PATENTS

| | | |
|---|---|---|
| 2,543,046 | Murray | Feb. 27, 1951 |
| 2,692,190 | Pritikin | Oct. 19, 1954 |
| 2,706,697 | Eisler | Apr. 19, 1955 |
| 2,758,074 | Black et al. | Aug. 7, 1956 |
| 2,767,137 | Evers | Oct. 16, 1956 |
| 2,799,637 | Williams | July 16, 1957 |
| 2,879,147 | Baker | Mar. 24, 1959 |